United States Patent [19]
Honda

[11] Patent Number: 5,704,593
[45] Date of Patent: Jan. 6, 1998

[54] FILM CARRIER TAPE FOR SEMICONDUCTOR PACKAGE AND SEMICONDUCTOR DEVICE EMPLOYING THE SAME

[75] Inventor: Hirokazu Honda, Tokyo, Japan

[73] Assignee: NEC Corporation, Tokyo, Japan

[21] Appl. No.: 780,844

[22] Filed: Jan. 9, 1997

Related U.S. Application Data

[63] Continuation of Ser. No. 302,953, Sep. 12, 1994, abandoned.

[30] Foreign Application Priority Data

Sep. 20, 1993 [JP] Japan .................................. 5-232983

[51] Int. Cl.$^6$ .................................................. H01L 23/495
[52] U.S. Cl. ........................... 256/668; 257/671; 257/673; 257/676; 257/191
[58] Field of Search ........................... 257/668, 692, 257/676, 666, 672, 700, 690, 691, 677, 671, 670, 667, 779–784, 673

[56] References Cited

U.S. PATENT DOCUMENTS

| | | | |
|---|---|---|---|
| 3,628,105 | 12/1971 | Sakai | 257/691 |
| 4,680,613 | 7/1987 | Daniels et al. | 257/691 |
| 4,763,409 | 8/1988 | Takekawa et al. | 257/672 |
| 4,801,999 | 1/1989 | Hayward et al. | 357/70 |
| 4,967,260 | 10/1990 | Butt | 257/668 |
| 5,028,983 | 7/1991 | Bickford et al. | 257/668 |
| 5,073,817 | 12/1991 | Ueda | 257/668 |
| 5,220,195 | 6/1993 | McShane et al. | 257/691 |
| 5,220,196 | 6/1993 | Michii et al. | 257/676 |
| 5,221,858 | 6/1993 | Higgins, III | 257/666 |
| 5,355,105 | 10/1994 | Angelucci, Sr. | 257/691 |
| 5,359,222 | 10/1994 | Okumoto et al. | 257/659 |

FOREIGN PATENT DOCUMENTS

| | | |
|---|---|---|
| 47-3206 | 1/1972 | Japan . |
| 62-46537 | 2/1987 | Japan . |

OTHER PUBLICATIONS

ITAP '93 Proceeding, Brian Lynch, "Two Metal Layer Package Enhancement", pp. 75–84 (1993).
Electronic Packaging & Production, Howard W. Markstein, "TAB Tames High–Density Chip I/OS", pp. 42–44, Dec. 1988.

Primary Examiner—Mahshid D. Saadat
Assistant Examiner—Jhihan B. Clark
Attorney, Agent, or Firm—Sughrue,Mion,Zinn,Macpeak & Seas, PLLC

[57] ABSTRACT

A film carrier tape for a semiconductor package comprises a tape base film having a signal plane with leads disposed thereon and a ground plane on the surface opposite the signal plane. The ground plane has ground plane leads projecting into a device hole and OLB lead holes defined in the tape base film, the ground plane leads confronting the leads on the signal plane. The ground plane leads are electrically connected to selected leads on the signal plane.

6 Claims, 4 Drawing Sheets

FILM CARRIER TAPE FOR SEMICONDUCTOR PACKAGE AND SEMICONDUCTOR DEVICE EMPLOYING THE SAME

This is a Continuation of application Ser. No. 08/302,953 filed Sep. 12, 1994, now abandoned.

BACKGROUND OF THE INVENTION

1. Field of the Invention

The present invention relates to a film-carrier-mounted semiconductor device, and more particularly to a film carrier tape for a semiconductor package, which has a multiple metal layer for improved electric characteristics, and a semiconductor device which employs such a film carrier tape.

2. Description of the Related Art

FIGS. 8 through 11 of the accompanying drawings show a conventional film-carrier-mounted semiconductor device.

The conventional film-carrier-mounted semiconductor device is fabricated as follows: As shown in FIGS. 8 and 9, a film carrier tape 6 and a semiconductor chip 2 having metallic bumps 9 on respective electrode terminals thereof are prepared.

The film carrier tape 6 comprises an insulative tape base film made of polyimide or the like. The insulative tape base film has sprocket holes 1 defined therein along opposite longitudinal edges thereof for feeding and positioning the film carrier tape 6, a device hole 3 defined therein for placing the semiconductor chip 2 therein, OLB (outer lead bonding) lead holes 7 defined therein, and tie bars 8. A metal film such as of copper (Cu) is applied to the tape base film and then selectively etched by a photoresist process, thereby forming leads 4 of desired shapes and electric selection pads 5, which are thereafter plated with gold(Au), tin(Sn), or solder.

Then, the leads 4 on the film carrier tape 6 and the bumps 9 on the semiconductor chip 2 are joined to each other by thermocompression or eutectic inner lead bonding (ILB). A probe (not shown) of an inspecting device is brought into contact with each of the pads 5 on the film carrier tape 6 for electric selection and a bias test, after which the film-carrier-mounted semiconductor device is completed. It is often customary to attach suspenders 10 as insulating film frames to the film carrier tape 6 for thereby preventing the leads 4 from being deformed in the presence of the device hole 3, the OLB lead holes 7, and the tie bars 8, or, as shown in FIG. 10, to seal the semiconductor chip 2 with a resin mass 11 for increased reliability and mechanical protection.

To mount the film-carrier-mounted semiconductor device, the leads 4 are cut to a desired length, and the semiconductor chip 2 is fixed to a printed-circuit board 13 (see FIG. 11) by an adhesive 12. Thereafter, the leads 4 are joined to bonding pads 14 on the printed-circuit board 13 by outer lead bonding (OLB). The film-carrier-mounted semiconductor device can quickly be mounted on the printed-circuit board 13 because the bonding process can be carried out once irrespective of the number of leads, and the mounting process can easily be automatized as the film carrier tape 6 is employed. A process of fabricating such a film-carrier-mounted semiconductor device is known from Japanese patent publication No. 47-3206, for example.

The conventional film-carrier-mounted semiconductor device is prone to various problems resulting from the high-performance capabilities of recent semiconductor chips. For example, high-performance semiconductor devices are connected to a large number of leads, have a high electric power requirement, and operate at a high speed. These characteristics affect the packaging of semiconductor devices. Particularly, the many leads that are used make it difficult for semiconductor devices to operate at higher speeds. Specifically, the increased number of leads used reduces the lead pitch, which results in a reduction in the lead width. The reduced lead width in turn increases the electric resistance of the leads. On the other hand, higher-speed operation of semiconductor chips requires the wire resistance to be reduced to maintain the desired performance, and efforts to improve electric characteristics such as impedance matching, wire capacity, etc., are directed to semiconductor device packages. For improving electric characteristics, it is basically important to limit the length of the wires. However, even though leads of a film-carrier-mounted semiconductor device mounted on the circuit board may be minimized to provide satisfactory overall device characteristics, if the wires extending up to electric selection pads on the film carrier tape of the film-carrier-mounted semiconductor device are long, then the electric selection of the film-carrier-mounted semiconductor device cannot be carried out sufficiently prior to mounting on the circuit board.

Generally, although the lead pitch over the OLB lead holes of the film-carrier-mounted semiconductor device may be selected in the range of from 0.1 to 0.2 mm to shorten the leads up to the OLB lead holes, the electric selection pads must be spaced at a pitch ranging from 0.3 to 0.4 mm for sufficient electric selection because of limitations imposed by the probe of an inspecting device. Therefore, if the film-carrier-mounted semiconductor device has many leads, then the wires extending from the leads over the OLB lead holes to the electric selection pads are relatively long.

One solution which is disclosed in Japanese laid-open patent publication No. 62-46537 is to join a film-carrier-mounted semiconductor device to an electric selection baseboard with two or more layers which has improved electric characteristics, by outer lead bonding, effect electric selection on the film-carrier-mounted semiconductor device, and thereafter, cut the leads of the film-carrier-mounted semiconductor device at a desired position to separate the film-carrier-mounted semiconductor device from the electric selection baseboard, and finally join the film-carrier-mounted semiconductor device to a printed-circuit board by outer lead bonding. The disclosed process allows improvement of the electric selection but is disadvantageous in that the film-carrier-mounted semiconductor device itself is not improved, and furthermore, any failure of the outer lead bonding results in a waste of expensive semiconductor chips, and the outer lead bonding must bond the film-carrier-mounted semiconductor device to the electric selection baseboard.

*Electronic Packaging & Production*, December 1988, pp. 42–44, shows a process for improving electric characteristics by forming a ground plane opposite a surface of a film carrier tape on which leads are disposed over an insulating film, the leads including some ground leads, and connecting the ground leads to the ground plane using through holes. The film carrier tape of such a structure is referred to as a "two-metal tape" because ground planes or metal layers are disposed on the respective opposite surfaces of the insulating film. The film carrier tape is suitable for achieving desired impedance matching.

As disclosed in the above publication, for further improving electric characteristics, it is desirable for the film carrier tape to have a similar power supply layer for several types of power supply leads included in addition to the ground leads. The film carrier tape must have three or more layers, and preferably five or six layers or more, including the ground lead, power supply lead, and signal lead layers.

In the process of manufacturing a film carrier tape, however, it is highly difficult to provide three or more metal layers while cantilevered leads project into the device hole in the film carrier tape. Even if it is technically possible to provide three or more metal layers, the resultant film carrier tape is expensive.

FIG. 12 of the accompanying drawings shows in cross section a conventional two-metal tape. The conventional two-metal tape shown in FIG. 12 has a signal plane on which leads 4 are formed in a desired pattern and a ground plane 15 on the opposite side from the signal plane. To ground the leads 4 to the ground plane 15, it is necessary to define via holes 16 in the tape. The formation of the via holes 16 is primarily responsible for the increased cost of the two-metal tape and also for the difficulty in spacing the leads at a fine pitch.

SUMMARY OF THE INVENTION

It is therefore an object of the present invention to provide a film carrier tape for a semiconductor package which has improved electric characteristics and which entails lower cost, and a semiconductor device which employs such a film carrier tape.

To achieve the above object, there is provided in accordance with the present invention a film carrier tape for a semiconductor package comprising a tape base film having a device hole defined therein for placing a semiconductor chip therein and outer lead bonding lead holes defined therein in a surrounding relation to the device hole, the tape base film including a suspender disposed between the device hole and the outer lead bonding lead holes, and a pair of metal layers disposed on opposite surfaces of the tape base film, one of the metal layers having a plurality of patterned leads and the other of the metal layers having a plurality of patterned ground plane leads, the patterned leads and patterned ground plane leads both projecting into the device hole and the outer lead bonding lead holes in a confronting relation to each other.

According to the present invention, there is also provided a film carrier tape for a semiconductor package comprising a tape base film having a device hole defined therein for placing a semiconductor chip therein, slits defined therein in a surrounding relation to the device hole, and outer lead bonding lead holes defined therein in a surrounding relation to the device hole and the slits, the tape base film including first suspenders disposed between the device hole and the slits and second suspenders disposed between the slits and the outer lead bonding lead holes, and a pair of metal layers disposed on opposite surfaces of the tape base film, one of the metal layers having a plurality of patterned leads and the other of the metal layers having a plurality of patterned ground plane leads, the patterned leads and patterned ground plane leads both projecting into the device hole and the slits in a confronting relation to each other.

The ground plane leads of the other metal layer may be electrically connected to selected leads of the metal layer.

According to the present invention, there is further provided a semiconductor device comprising a film carrier tape of the above structure, and a semiconductor chip disposed in the device hole and electrically connected to the leads of the metal layer.

As described above, one of the metal layers is patterned into a plurality of leads of given shapes, and the other metal layer is patterned into a plurality of ground plane leads which project into the device hole and the OLB holes in confronting relation to the leads. The ground plane leads of one metal layer are electrically connected to selected leads of the other metal layer. With such an arrangement, the inductance of leads for applying potentials is reduced, preventing the semiconductor device from malfunctioning due to a potential drop or Joule heat. Potential fluctuations are also prevented in the leads for transmitting signals, thereby allowing easy achievement of impedance matching. As via holes need not be defined in the tape base film, spacing of leads at a fine pitch is enabled, and the film carrier tape, which is of a two-metal tape structure, can be manufactured at a low cost.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

1st Embodiment

Figure 1:
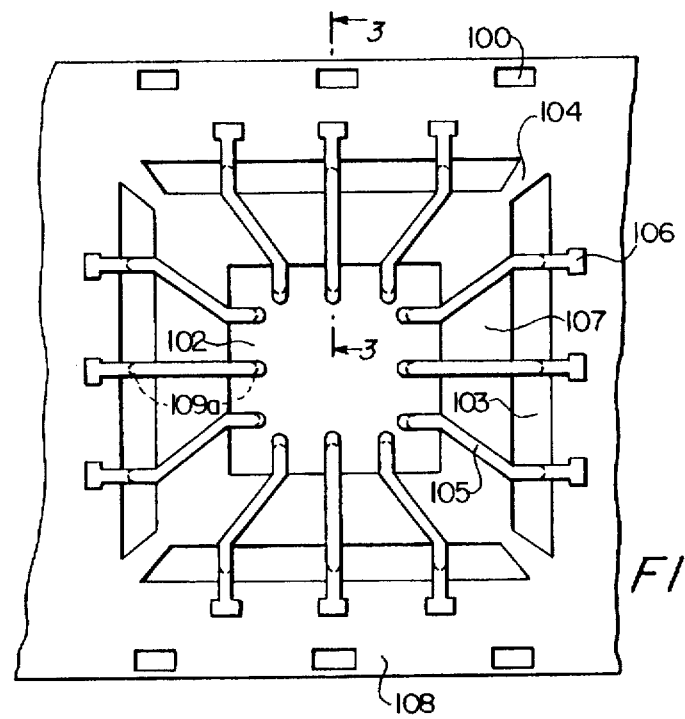
FIG. 1 is a plan view of a film carrier tape for a semiconductor package according to a first embodiment of the present invention, the film carrier tape being viewed from the signal plane thereof.
Figure 2:
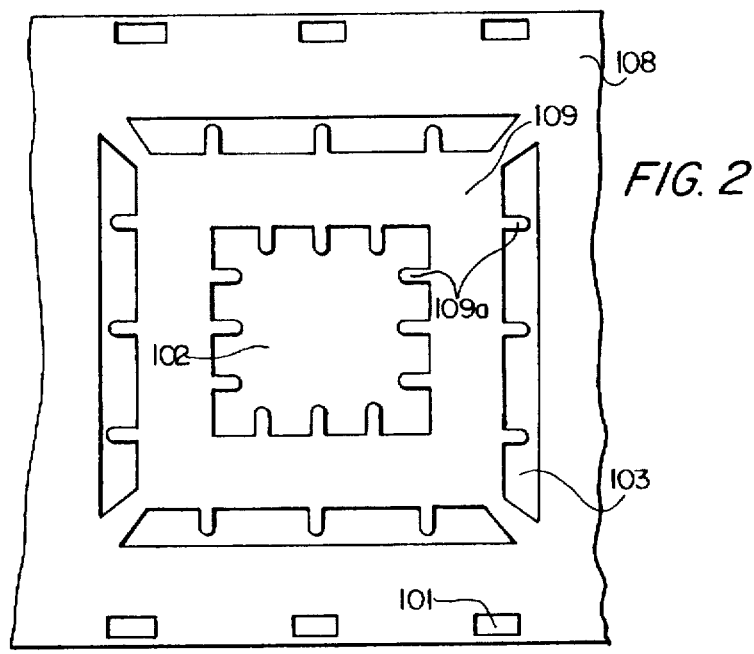
FIG. 2 is a plan view of the film carrier tape for a semiconductor package according to the first embodiment, the film carrier tape being viewed from the ground plane thereof.
Figure 3:
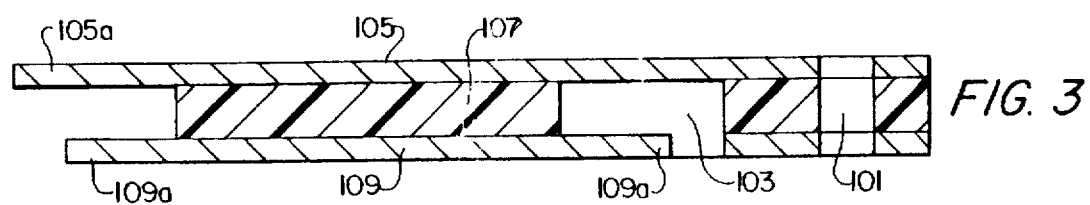
FIG. 3 is a cross-sectional view taken along line III—III of FIG. 1.

FIGS. 1 through 3 show a film carrier tape for a semiconductor package according to a first embodiment of the present invention.

As shown in FIG. 1, the film carrier tape for a semiconductor package comprises an insulative tape base film 108 made of polyimide or the like. The insulative tape base film 108 has sprocket holes 101 defined therein along opposite longitudinal edges thereof for feeding and positioning the film carrier tape, a device hole 102 defined therein for placing a semiconductor chip (not shown) therein, OLB lead holes 103 defined therein in a surrounding relation to the device hole 102, and tie bars 104. A metal film such as of copper (Cu) is applied as a signal plane to one surface of the tape base film 108 and then selectively etched by a photoresist process, thereby forming leads 105 of desired shapes and electric selection pads 106, which are thereafter plated with gold (Au), tin (Sn), or solder. The tape base film 108 also has a rectangular suspender 107 defined by the device hole 102 and the OLB lead holes 103 and supported by the tie bars 104.

As shown in FIG. 2, the tape base film 108 has a ground plane (ground layer) 109 on the surface opposite the signal plane thereof. The ground plane 109 has ground plane leads 109a (see also FIG. 3) projecting beyond the suspender 107 into the device hole 102 and the OLB lead holes 103 in a confronting relation to the respective leads 105 on the signal plane. The ground plane leads 109a are shorter than inner leads 105a which project from the respective leads 105 into the device hole 102 and are also shorter than the width of the OLB lead holes 103. The film carrier tape for a semiconductor package shown in FIGS. 1 through 3 can be fabricated in the same manner as the conventional two-metal tape.

As described above, the ground plane leads 109a are electrically connected to the leads 105, and a semiconductor chip disposed in the device hole 102 is electrically connected to the inner leads 105a, thereby producing a film-carrier-mounted semiconductor device.

Figure 4A:
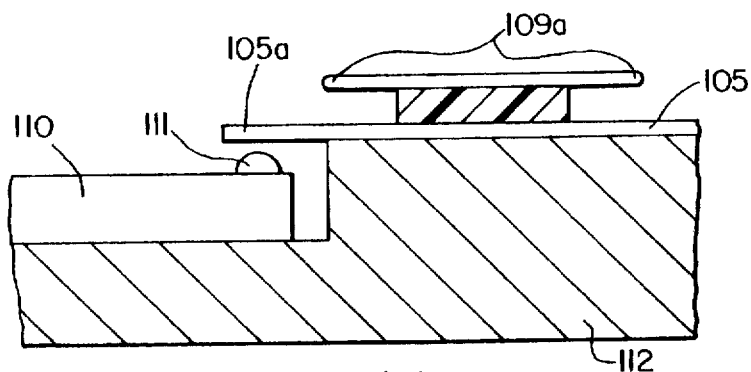
FIGS. 4(a) through 4(c) are cross-sectional views showing a process of fabricating a semiconductor device which employs the film carrier tape.
Figure 4B:
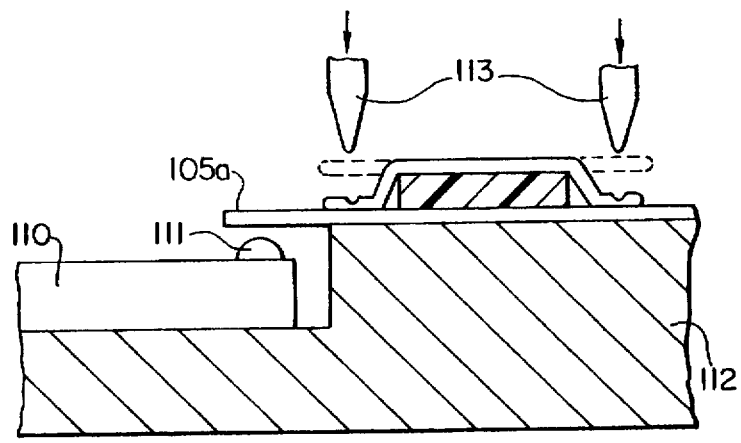
Figure 4C:
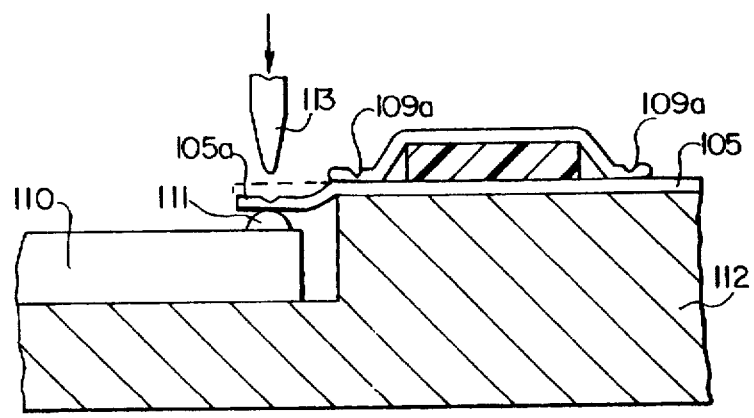

A process of fabricating such a film-carrier-mounted semiconductor device will be described below with reference to FIGS. 4(a) through 4(c).

The film carrier tape is supported on a bonding stage 112 over which a single-point bonding tool 113 is vertically and movably disposed. A semiconductor chip 110 has bumps 111 on respective electrode terminals or pads thereof.

The fabrication process relies on the known single-point inner lead bonding technology. As shown in FIG. 4(a), the film carrier tape is placed on the bonding stage 112 such that the signal plane is in contact with an upper surface of the bonding stage 112, and the semiconductor chip 110 is placed on the bonding stage 112 so as to be positioned below the device hole 102. Then, in a first bonding step, as shown in FIG. 4(b), only those ground plane leads 109a which correspond to ground terminals of the semiconductor chip 110 are electrically connected to the leads 105 on the signal plane by the bonding tool 113. Thereafter, in a second bonding step, as shown in FIG. 4(c), the inner leads 105a are electrically connected to the bumps 111 on the electrode pads of the semiconductor chip 110 by the bonding tool 113. Subsequently, the semiconductor chip 110 may be sealed by a resin mass or the like for mechanical protection. Thereafter, a probe (not shown) of an inspecting device is brought into contact with each of the electric selection pads 106 on the film carrier tape for electric selection and a bias test, after which the film-carrier-mounted semiconductor device is completed.

2nd Embodiment

Figure 5:
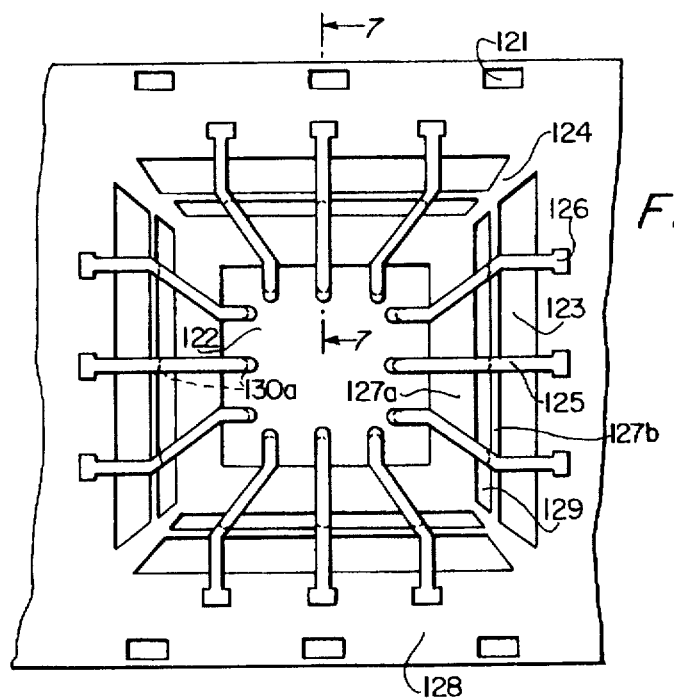
FIG. 5 is a plan view of a film carrier tape for a semiconductor package according to a second embodiment of the present invention, the film carrier tape being viewed from the signal plane thereof.
Figure 6:
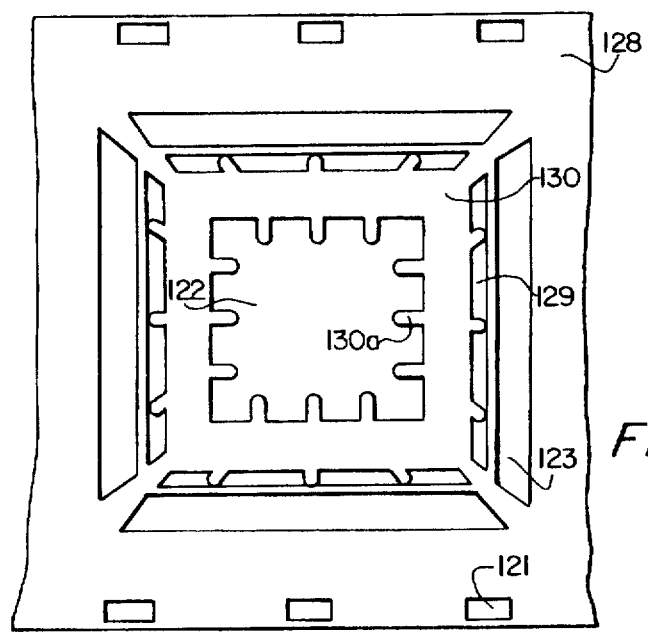
FIG. 6 is a plan view of the film carrier tape for a semiconductor package according to the second embodiment, the film carrier tape being viewed from the ground plane thereof.
Figure 7:
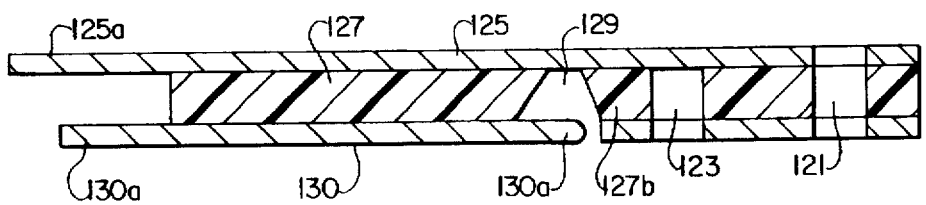
FIG. 7 is a cross-sectional view taken along line VII—VII of FIG. 1.
Figure 8:
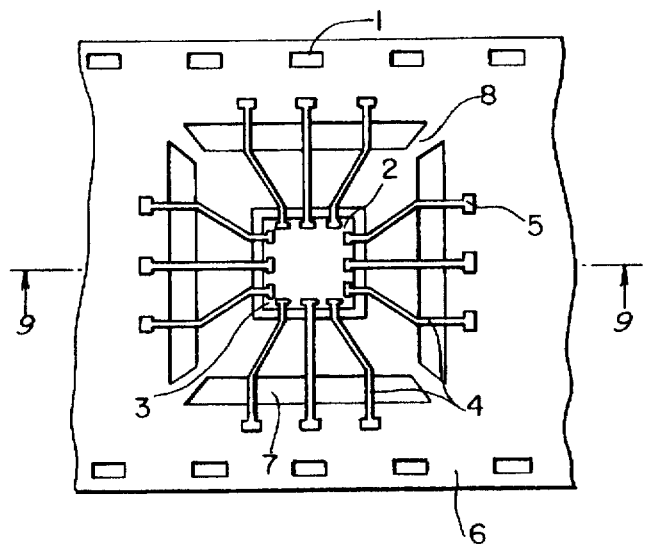
FIG. 8 is a plan view of a conventional film-carrier-mounted semiconductor device.
Figure 9:
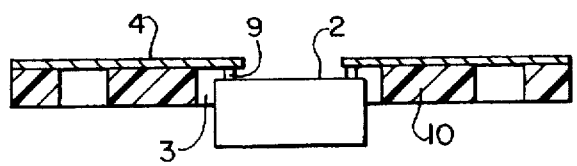
FIG. 9 is a cross-sectional view taken along line IX—IX of FIG. 8.
Figure 10:
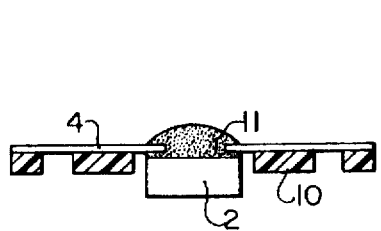
FIG. 10 is a cross-sectional view of the film-carrier-mounted semiconductor device shown in FIG. 9 which is sealed by a resin mass.
Figure 11:
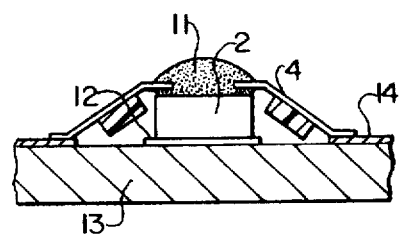
FIG. 11 is a cross-sectional view of the film-carrier-mounted semiconductor device shown in FIG. 10 which is mounted on a baseboard.
Figure 12:
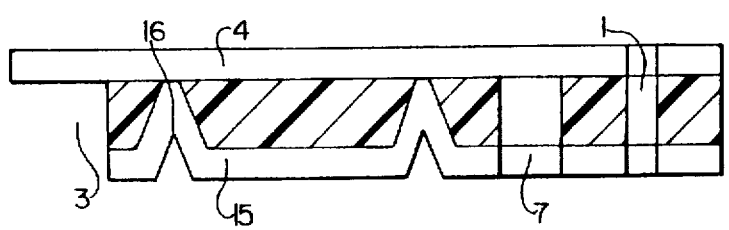
FIG. 12 is a cross-sectional view of a conventional two-metal tape.

FIGS. 5 through 7 show a film carrier tape for a semiconductor package according to a second embodiment of the present invention.

As shown in FIG. 5, the film carrier tape for a semiconductor package comprises an insulative tape base film 128 made of polyimide or the like. The insulative tape base film 128 has sprocket holes 121 defined therein along opposite longitudinal edges thereof for feeding and positioning the film carrier tape, a device hole 122 defined therein for placing a semiconductor chip (not shown) therein, slits 129 defined therein in a surrounding relation to the device hole 122, OLB lead holes 123 defined therein in a surrounding relation to the device hole 122 outwardly of the respective slits 129, and tie bars 124. The tape base film 128 also has two rectangular suspenders 127a, 127b defined by the device hole 122, the slits 129, and the OLB lead holes 123 and supported by the tie bars 124. A metal film such as of copper (Cu) is applied as a signal plane to one surface of the tape base film 108 and then selectively etched by a photoresist process, thereby forming leads 125 of desired shapes and electric selection pads 126, which are thereafter plated with gold (Au), tin (Sn), or solder.

As shown in FIG. 6, the tape base film 128 has a ground plane (ground layer) 130 on a surface opposite to the signal plane thereof. The ground plane 130 has ground plane leads 130a (see also FIG. 7) projecting beyond the suspender 127a into the device hole 122 and the slits 129 in a confronting relation to the respective leads 125 on the signal plane. The ground plane leads 130a are shorter than inner leads 125a which project from the respective leads 125 into the device hole 122 and also shorter than the width of the slits 129. The film carrier tape for a semiconductor package shown in FIGS. 5 through 7 can be fabricated in the same manner as the conventional two-metal tape. A semiconductor device which employs the film carrier tape according to the second embodiment can be fabricated in the same manner as the semiconductor device which employs the film carrier tape according to the first embodiment, i.e., in the fabrication process shown in FIGS. 4(a) through 4(c).

In the second embodiment, the slits 129 are positioned between the suspenders 127a, 127b, and the ground plane leads 130a and the leads 125 are electrically connected to each other in the slits 129. Therefore, any effect of the OLB lead holes 123 on the leads 125 is small. Accordingly, the film carrier tape according to the second embodiment may advantageously be incorporated in a film-carrier-mounted semiconductor device of which high reliability is required.

With the arrangement of the present invention, as described above, leads of given shapes are formed on a signal plane as a metal layer on one surface of the tape base film, and ground plane leads project from a ground plane formed as a metal layer on the opposite surface of the tape base film into a device hole and OLB holes in a confronting relation to the respective leads on the signal plane. The ground plane leads are electrically connected to selected leads on the signal fplane. The film carrier tape in the form of a two-metal tape thus constructed has greatly improved electric characteristics.

Since the two-metal tape structure of the film carrier tape according to the present invention need not have via holes for reducing the ground impedance, the film carrier tape according to the present invention is advantageous in that its leads can be spaced at a fine pitch and it can be manufactured at a low cost.

Although certain preferred embodiments of the present invention have been shown and described in detail, it should be understood that various changes and modifications may be made therein without departing from the scope of the appended claims.

What is claimed is:

1. A semiconductor device comprising a semiconductor chip having a plurality of electrodes and a film carrier tape provided for leading out each of said electrodes of said semiconductor chip, said film carrier tape including:

an insulating film having a first main surface and a second main surface opposing to said first main surface, a plurality of first leads formed on said first main surface apart from one another and each having a first portion which projects from said insulating film and is bonded to an associated one of said electrodes of said semiconductor chip, and at least one second lead formed on said second main surface of said insulating film and having a second portion which projects from said insulating film, said second portion of said at least one second lead being bent toward and bonded to said first portion of one of said first leads.

2. The device as claimed in claim 1, wherein:

said one of said first leads further has a third portion projecting from said insulating film in a direction opposite to a projecting direction of said first portion thereof, and said at least one second lead further has a fourth portion projecting from said insulating film in a direction opposite to a projecting direction of said second portion, said fourth portion being bent toward and connected to said third portion of said one of said first leads.

3. The device as claimed in claim 1, wherein said at least one second lead is supplies with a ground voltage.

4. A semiconductor device comprising a semiconductor chip having a plurality of electrodes and a film carrier tape provided for leading out each of said electrodes of said semiconductor chip, said film carrier tape including:

an insulating film having a first main surface and a second main surface opposing to said first main surface, a plurality of first leads formed on said first main surface apart from one another, each having a first portion which projects from said insulating film and is bonded to an associated one of said electrodes of said semiconductor chip, and a conductive film formed on said second main surface and having a plurality of second leads each projecting from said insulating film, said second leads spaced apart from one another and corresponding to an associated one of said first portions, at least one of said second leads of said conductive film being bent toward and bonded to an associated one of said first portions, said second leads that are not bent and bonded to an associated one of said first portions being parallel with an associated one of said first portions.

5. The device as claimed in claim 4, wherein:

said one of said first leads further has a second portion projecting from said insulating film in a direction opposite to a projecting direction of said first portion thereof, and said conductive film further has a plurality of third leads each projecting from said insulating film in a direction opposite to a projecting direction of said second leads, said third leads corresponding to an associated one of said second portions and with an associated one of said second leads, at least one of said third leads being bent and connected to an associated one of said second portions of said first leads such that said at least one of said second leads and said at least one of said third leads are electrically connected to an associated one of said first leads, said third leads that are not bent and connected to an associated one of said second portions being parallel with the associated second portion of one of said first leads.

6. The device as claimed in claim 4, wherein said conductive film is supplied with a ground voltage.

* * * * *

UNITED STATES PATENT AND TRADEMARK OFFICE
CERTIFICATE OF CORRECTION

PATENT NO.   : 5,704,593
DATED        : January 6, 1998
INVENTOR(S)  : Honda

It is certified that error(s) appears in the above-identified patent and that said Letters Patent is hereby corrected as shown below:

On the title page:

[30] Foreign Application Priority Data

Sep. 20, 1993 [JP]  Japan ............... 5-232893

Signed and Sealed this

Twenty-eighth Day of July, 1998

Attest:

BRUCE LEHMAN

*Attesting Officer*          *Commissioner of Patents and Trademarks*